United States Patent
Blair et al.

(10) Patent No.: US 7,278,081 B1
(45) Date of Patent: *Oct. 2, 2007

(54) OPTICAL TRANSPORT NETWORK FRAME STRUCTURE WITH IN-BAND DATA CHANNEL AND FORWARD ERROR CORRECTION

(75) Inventors: James Leroy Blair, San Diego, CA (US); Eric Minghorng Su, Tustin, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 838 days.

This patent is subject to a terminal disclaimer.

(21) Appl. No.: 10/171,297

(22) Filed: Jun. 13, 2002

(51) Int. Cl.
*H03M 13/00* (2006.01)
(52) U.S. Cl. .................... 714/752; 714/751; 714/701
(58) Field of Classification Search ............. 714/752, 714/751, 755, 774, 701, 702; 398/79, 98, 398/88
See application file for complete search history.

(56) References Cited

U.S. PATENT DOCUMENTS

| | | | |
|---|---|---|---|
| 6,570,912 B1 * | 5/2003 | Mirfakhraei | 375/222 |
| 6,594,047 B1 * | 7/2003 | Ballintine et al. | 398/79 |
| 6,598,200 B1 * | 7/2003 | Greenwood et al. | 714/774 |
| 6,724,996 B1 * | 4/2004 | Ballintine et al. | 398/98 |
| 6,829,741 B1 * | 12/2004 | Khansari et al. | 714/755 |
| 6,865,163 B1 * | 3/2005 | Bergenwall et al. | 370/288 |

* cited by examiner

*Primary Examiner*—Guy Lamarre
*Assistant Examiner*—Fritz Alphonse
(74) *Attorney, Agent, or Firm*—INCAPLAW; Terrance A. Meador (57) ABSTRACT

An optical transport network data frame structure is configured to provide an in-band data channel. The in-band channel data is contained in the data frame space that would otherwise be allocated to forward error correction ("FEC") bytes. Consequently, the provision of the in-band data channel does not affect the number of client data bytes contained in the data frame structure. In accordance with a practical embodiment, the data frame structure is compliant with Intra Domain Interface (IaDI) specifications set forth in International Telecommunication Union Telecommunication Standardization Sector (ITU-T) Recommendation Guide For Recommendation, G.709/Y.1331.

47 Claims, 9 Drawing Sheets

OPTICAL TRANSPORT NETWORK FRAME STRUCTURE WITH IN-BAND DATA CHANNEL AND FORWARD ERROR CORRECTION

CROSS REFERENCE TO RELATED APPLICATIONS

The subject matter of this application is related to the subject matter disclosed in U.S. patent application Ser. No. 10/170,995, filed concurrently herewith, now U.S. Pat. No. 7,028,241, the content of which is incorporated by reference herein.

FIELD OF THE INVENTION

The present invention relates generally to data communication systems. More particularly, the present invention relates to data frame structures utilized in optical transport networks.

BACKGROUND OF THE INVENTION

The prior art is replete with digital data communication systems that convey data between system sections or system components. Some data communication systems, such as optical transport networks (OTNs), transmit frame delineated serial streams of digital data, while other systems may transmit format-independent data streams. Conventional SONET/SDH networks transport data frames formatted in accordance with internationally standardized protocols. Generally, a data frame includes a relatively small number of bytes devoted to system overhead, a relatively small number of bytes devoted to forward error correction (FEC), and a relatively large number of bytes reserved for the actual client data payload. One specific data frame format utilized by OTNs is set forth in ITU-T Recommendation G.709/Y.1331 (International Telecommunication Union, February 2001). This data frame format is informally referred to as the "digital wrapper" format.

In a conventional digital wrapper frame, the FEC parity bytes cover the client data payload and the Operations, Administration, and Management (OA&M) overhead (including frame delineation) bytes. The standard digital wrapper frame structure utilizes all of the bytes allocated for FEC (1,024 bytes), regardless of the coding gain (error correction capability) actually required to correct for channel errors encountered within a given section of the data communication line. Consequently, prior art digital wrapper frames have no provision for an in-band data channel that receives FEC coverage.

BRIEF SUMMARY OF THE INVENTION

A data frame structure according to the present invention can be generated by modifying the known G.709 digital wrapper frame structure to provide an in-band data channel. By definition, the addition of the in-band data channel does not change the frame rate and/or the client data rate contained in the digital wrapper frame. In other words, the bits per second data rate of the serial stream is neither increased nor decreased with the inclusion of the in-band data channel. The preferred embodiment of the present invention establishes the in-band data channel by utilizing a portion of the bytes that would otherwise be allocated to FEC parity bytes. In this manner, the number of bytes devoted to FEC can be efficiently allocated, with excess bytes being allocated to the in-band data channel. The FEC process is designed to cover the OA&M overhead bytes, the client data, and the data associated with the in-band channel. The in-band data channel may also be referred to herein as the FEC data channel or the FDC (this nomenclature is used because the in-band data consumes frame space that would otherwise be allocated to FEC parity bytes).

The above and other aspects of the present invention may be carried out in one form by an optical transport network data frame structure comprising a fixed number of client data bytes and a fixed number of non-client data bytes including a number of in-band channel data bytes and a quantity of FEC parity bytes. The combination of the in-band channel data bytes and the FEC parity bytes occupy a fixed FEC/FDC data frame space in the frame structure.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. For example, the present invention may employ various integrated circuit components, e.g., memory elements, logic elements, look-up tables, and the like, which may carry out a variety of functions under the control of one or more microprocessors or other control devices. In addition, those skilled in the art will appreciate that the present invention may be practiced in conjunction with any number of data transmission protocols and that the system described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional techniques for data transmission, signal switching and routing, network control, frame synchronization, forward error correction, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

Figure 1:
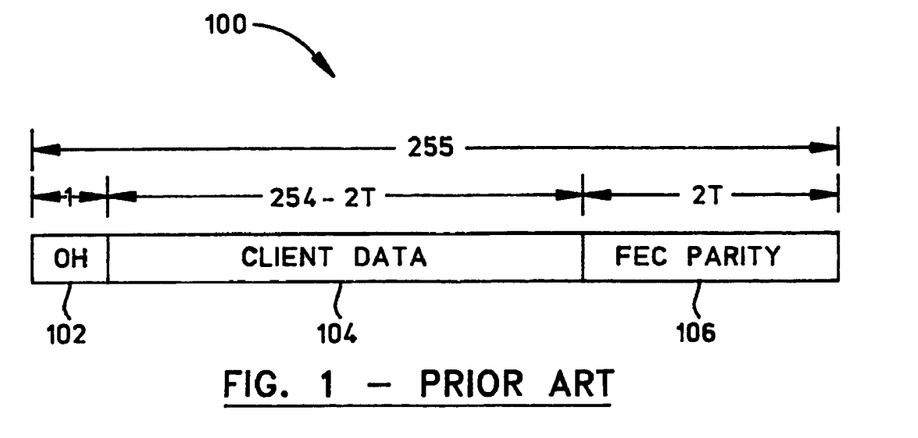
FIG. 1 is a diagram of a Reed-Solomon codeword format utilized by prior art optical transport networks.

Optical transport networks may be governed by the standards set forth in ITU-T Recommendation G.709/Y.1331 (International Telecommunication Union, February 2001), the content of which is incorporated by reference herein. For convenience, this Recommendation will be referred to herein as "G.709" or the "G.709 Standard." The G.709 Standard stipulates the use of the Reed-Solomon (RS) codeword as the fundamental basis for the Optical Transport Unit frame structure described therein. FIG. 1 is a diagram of a Reed-Solomon codeword format 100 utilized by prior art optical transport networks. Each codeword includes 255 8-bit bytes. The Reed-Solomon code stipulates that, to correct up to Terrors per codeword, 2T parity bytes must be generated. For compliance with the Inter Domain Interface (IrDI) requirements of G.709, codeword 100 is defined to include a T=8 FEC frame byte capacity. This configuration permits correction of up to eight errors per codeword. Therefore, 2T or 16 parity bytes are allocated for codeword error correction in an IrDI application. Of the remaining 239 bytes, one is allocated to an overhead ("OH") function and the other 238 bytes are allocated to client data. FIG. 1 shows the OH byte 102, the client data bytes 104, and the FEC parity bytes 106 within codeword 100.

Figure 2:
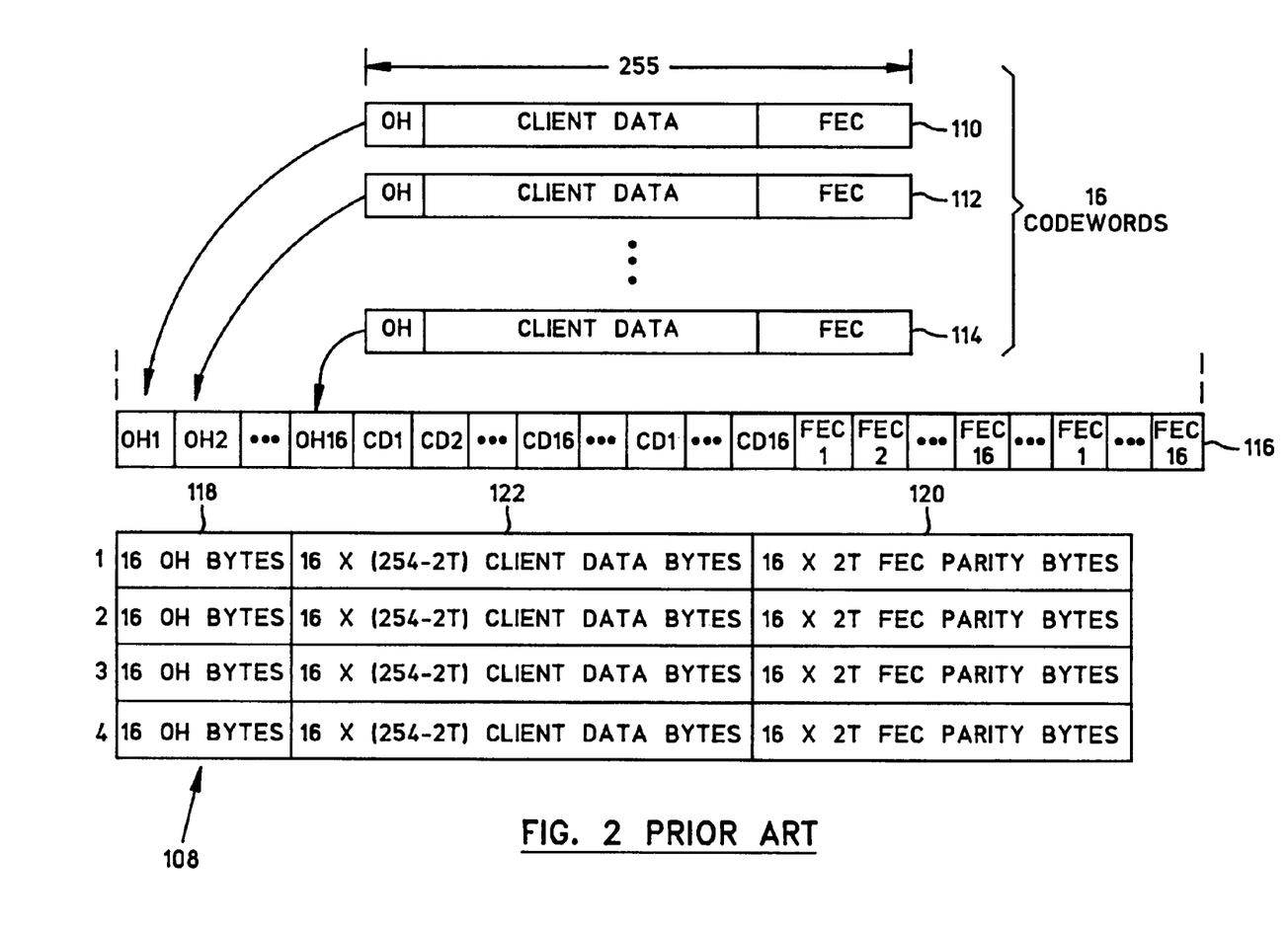
FIG. 2 is a diagram that represents the manner in which a prior art digital wrapper frame is formatted.

According to the G.709 Standard, an IrDI frame structure consists of four rows of 16 interleaved Reed-Solomon codewords formatted as shown in FIG. 1. In this regard, FIG. 2 is a diagram that represents the manner in which a prior art digital wrapper frame 108 is formatted. FIG. 2 shows a first codeword 110, a second codeword 112, and a sixteenth codeword 114, each of which is formatted like codeword 100. The third through fifteenth codewords are not shown in FIG. 2. A row (designated by reference number 116) of 4,080 bytes is constructed by byte-wise interleaving the sixteen codewords. Specifically, the first byte from codeword 110, which happens to be the OH byte, serves as the first byte of row 116, the OH byte from codeword 112 serves as the second byte of row 116, and so on. The OH byte from codeword 114 serves as the sixteenth byte of row 116, and the second byte from codeword 110, which happens to be the first client data byte, serves as the seventeenth byte of row 116. Using this interleaving scheme, sixteen interleaved OH bytes appear at the beginning of row 116, the OH bytes are followed by interleaved client data bytes, and the client data bytes are followed by interleaved FEC parity bytes.

A completely standardized G.709 IrDI Optical Transport Unit of rate K (OTUk) frame consists of four rows; the four rows are transmitted bit-wise serially, left to right, top to bottom. The G.709 IrDI frame 108 has a 16,320 byte frame capacity. Frame 108 includes 16 columns (64 bytes total) of OH bytes 118, which are used in part for frame delineation and various purposes such as OA&M functions, 256 columns of FEC parity bytes 120 (1,024 bytes total), and 3808 columns of client data 122 (15,232 bytes total).

Figure 3:
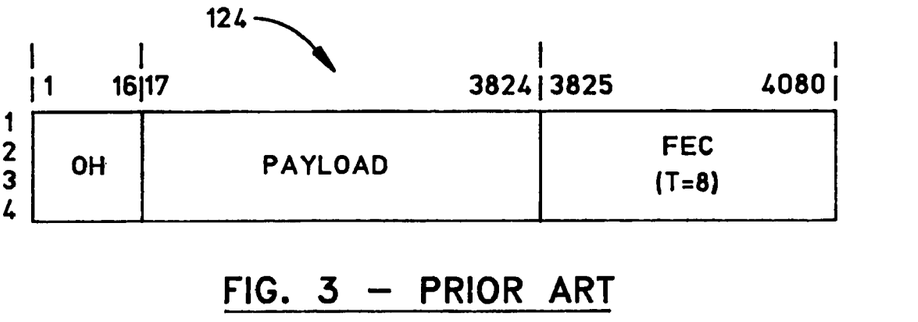
FIG. 3 is a diagram of a FEC enabled digital wrapper frame format.
Figure 4:
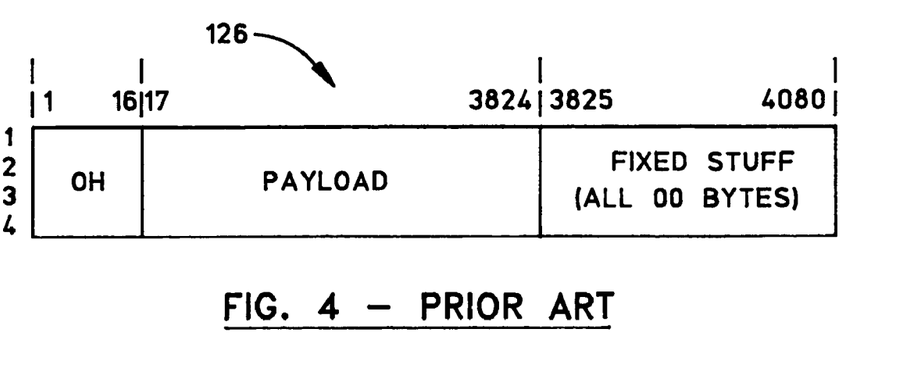
FIG. 4 is a diagram of a FEC disabled digital wrapper frame format.

Under G.709 IrDI frame compliance, two frame variants are permitted: one with FEC enabled and one with FEC disabled. FIG. 3 is a diagram of a FEC enabled digital wrapper frame format 124, and FIG. 4 is a diagram of a FEC disabled digital wrapper frame format 126. In frame 124, all 1,024 bytes allocated to FEC are utilized to handle up to 512 correctable errors (for RS T=8 per codeword) in the frame. In contrast, in frame 126, all 1,024 bytes allocated to FEC are set to zero bit values (i.e., a "fixed stuff") such that no error correction is possible. In other words, for IrDI applications, the frame structure either supports no FEC or the "maximum strength" FEC capable of correcting up to 512 errors per frame. Thus, if FEC is enabled and the OTN section has a relatively high signal-to-noise ratio (signifying a relatively error free channel), then a portion of the 1,024 bytes allocated to FEC represents wasted resources and wasted bandwidth.

Although IrDI frame structures must be configured in accordance with one of the two possible alternatives, the functionally standardized Intra Domain Interface (IaDI) OTUk frame structure (OTUkV) requirements of G.709 are not as restrictive. As a result, a data frame structure according to the present invention establishes an FDC using a portion of the 1,024 bytes that would otherwise be reserved entirely for FEC purposes. This data frame structure can be used to provide an embedded in-band signaling channel compatible with IaDI frame structures as permitted under the G.709 Standard. In addition, the data frame structure is suitably configured to provide FEC coverage that includes the overhead stream, the client data payload stream, and the additional in-band FDC stream. In accordance with a practical embodiment, the FDC can be terminated at edge applications requiring byte drop and/or insert capability.

Figure 5:
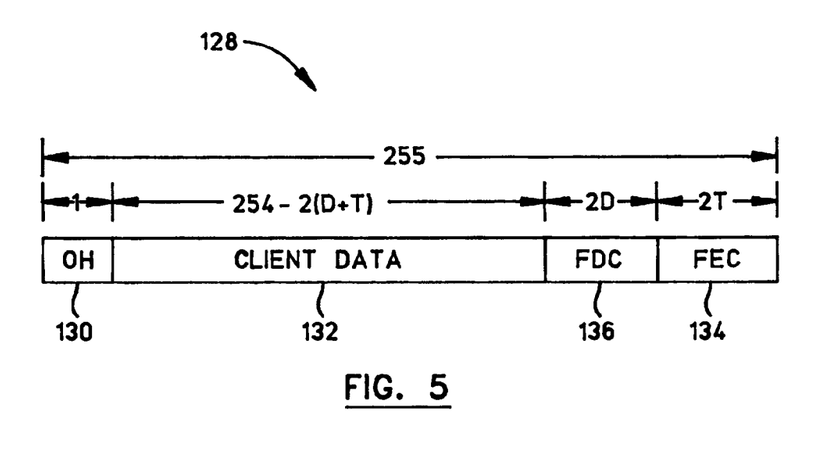
FIG. 5 is a diagram of a codeword format that accommodates an in-band data channel ("FDC")

FIG. 5 is a diagram of a codeword 128 that may be utilized to construct a data frame having an FDC. The specific FEC block code used may be a Reed-Solomon code, a suitable alternative code type, or a code type developed in the future. For purposes of this description, and as depicted in FIG. 5, the G.709 Reed-Solomon block code having the capability of up to T-error correction per codeword will serve as an illustration vehicle.

In the preferred embodiment of the invention, codeword 128 includes 255 8-bit bytes. The first byte (identified by reference number 130) is an OH byte, and the client data bytes 132 follow the OH byte 130. The last 2T bytes in codeword 128 are FEC parity bytes 134, and 2D bytes in codeword 128 are utilized for the FDC bytes 136 (D and T are both integer values). In accordance with the preferred practical embodiment, the sum of D and T equals eight to maintain G.709 IrDI frame structure/rate transparency. The FDC bytes 136 are located within the frame space bounded by the client data bytes 132 and the FEC parity bytes 134. As defined, the FDC bytes 136 will receive FEC error detection/correction coverage.

As shown in FIG. 5, FDC bytes 136 are placed adjacent to client data bytes 132 within codeword 128. The capacity of the FDC in codeword 128 is 2D bytes, where D is an integer within a range of 0 to 8–T. If D=0, then the FDC is not enabled in codeword 128. In practice, client data bytes 132 and FDC bytes 136 are concatenated such that T-error correction coverage is provided over the combination of bytes. The 2T FEC parity bytes 134 are placed at the end of codeword 128. In the preferred embodiment, T falls within a suggested range of 0 to 8. If T=0, then FEC is not enabled in codeword 128. For practical reasons, a lower limit of T=3 is considered to yield a meaningful minimum degree of coding gain. Assuming that the length of codeword 128 is 255 bytes, then the client data capacity equals 254−2(D+T) bytes. A practical embodiment may also utilize integer values of T and D, where their sum exceeds eight. In this case, the codeword structure would permit a larger FDC capacity and/or increased "strong-FEC" coding gain. The inclusion of a much larger FDC and/or FEC content within the RS codeword would subtract from the client data capacity within each fixed byte length codeword This could potentially result in a much greater frame rate increase over and above that imparted by the addition of the G.709 IrDI digital wrapper. Current OTN strong-FEC encoding considerations have suggested an upper practical limit of +25% rate expansion over the client rate embedded within the frame (in contrast, the G.709 IrDI wrapper rate represents a frame data over client data rate increase of approximately +7.14% for OTUk=1 framing). Therefore, for a 25% rate expansion, the RS 255 byte T=25 FEC frame byte capacity codeword would consist of fifty "2(D+T)" FDC/FEC bytes, 204 client data bytes, and the solitary byte allocated to OA&M overhead. (RS coding with large values of T, however, offers diminished performance results due in part to expanded bandwidth requirements and, more importantly, in part to significant decoder/encoder processing latency (i.e., network data delay). A practical embodiment of the present invention would necessarily require some other or yet to be developed error correction coding algorithm to fully substantiate the use of the 25% overhead bandwidth occupied. For paradigm purposes, an RS coding of T≦25 is deemed valid.) For practical purposes, a meaningful RS coded strong-FEC lower limit would be T=8. The combined FEC parity limits would result in a useful T range of 8≦T≦25 and establish a corresponding FDC capacity range of 0≦D≦17 for 2(D+T)=50. Of course, either T or D, as stated above for the case of T=8 FEC frame byte capacity, may be equal to zero resulting in the full 50 parity byte strong-FEC allocation per codeword to be allocable for use as either all FDC or FEC accordingly.

Figure 6:
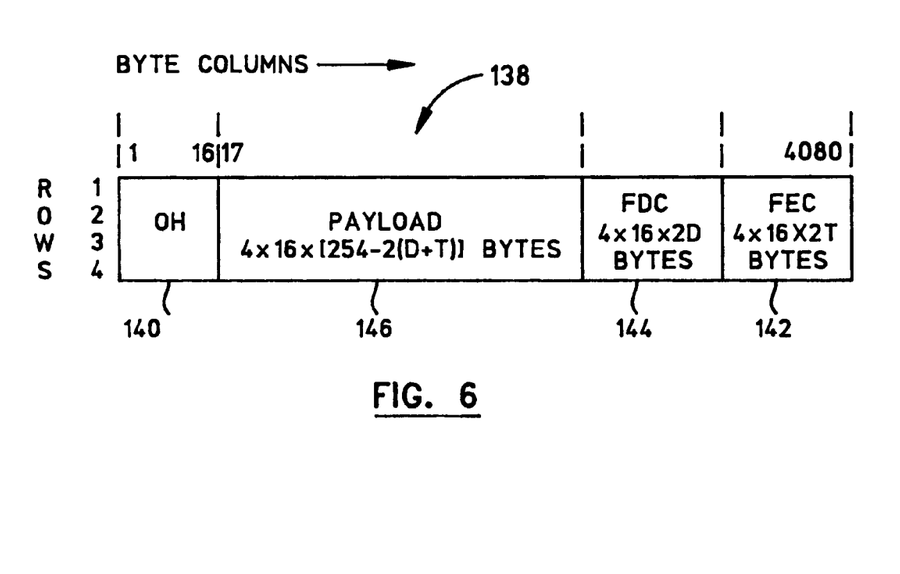
FIG. 6 is a diagram of a data frame structure that accommodates an FDC.

As functionally standardized in G.709, and as described above, codewords formatted in accordance with codeword 128 can be interleaved to yield an IaDI compatible data frame structure. In this regard, FIG. 6 is a diagram of a data frame structure 138 that accommodates an FDC. Notably, OTUkV data frame structure 138 shares several characteristics with conventional digital wrapper frames. For example: data frame structure 138 includes four serially-transmitted rows, each of which includes 16 interleaved codewords; each row contains 4,080 bytes and, consequently, data frame structure 138 contains 16,320 total bytes; and 16 bytes from each of the four rows (64 bytes total) are utilized as OH bytes 140. In contrast to conventional digital wrapper frames, data frame structure 138 is configured to accommodate an FDC as described above. In this regard, the number of bytes allocated to FEC in each row is (16×2T=327); thus, data frame structure 138 includes a total of (4×16×27) FEC parity bytes 142. As defined above, T represents the number of correctable byte errors per codeword. In other words, the value of T corresponds to the magnitude or strength of FEC applied to the overhead byte, the client data bytes, and to the FDC bytes per codeword. The number of bytes allocated to the FDC in each row is (16×2D=32D); thus, data frame structure 138 includes a total of (4×16×2D) FDC bytes 144. The remaining bytes in data frame structure 138 are utilized for the client data payload; the number of client data bytes 146 equals [4×16× (254−2(D+T))]. In a practical embodiment where the sum of D and T equals eight for IrDI frame rate compatibility, each row contains 3,808 client data bytes.

The data rate of the FDC (bits per second), is related to the integer values of D and T, along with the client data rate (bits per second):

$$FDC \text{ Rate} = \text{Client Data Rate} \times \frac{2D}{[254 - 2(D+T)]}$$

The OTUkV transport rate expansion over the client data rate is also related to the integer values of D and T, along with the client data rate:

$$OTUkV \text{ Rate} = \text{Client Data Rate} \times \frac{255}{[254 - 2(D+T)]}$$

The configuration of data frame structure 138 (or any data frame structure configured in accordance with the present invention) is maintained for a given data communication session conducted over a section, path, or other defined portion of a network. In addition, the data frame configuration may be maintained for a given interdomain data communication session. In this regard, a plurality of data frame structures 138 transmitted during a data communication session preferably include a fixed number of client data bytes and a fixed number of non-client data bytes, where the non-client data bytes include a number (i.e., one or more) of FDC bytes and a quantity (i.e., zero or more) of FEC parity bytes occupying a fixed FEC/FDC data frame space. In the example embodiment, the fixed FEC/FDC data frame space is the total frame space allocated for FDC bytes and FEC bytes, and the non-client data bytes also include a fixed number of overhead bytes (e.g., 64 overhead bytes). In the typical scenario where both FDC and FEC are provisioned, the combination of FDC bytes 144 and FEC parity bytes 142 fully occupy the fixed FEC/FDC data frame space. In the preferred practical embodiment where the sum of D and T equals eight, each row of the data frame structure has 256 bytes allocated to the FEC/FDC data frame space (for a total of 1,024 bytes per frame).

The FDC bytes 144 may be utilized to provide one or more "distinct" channels per frame. For example, data frame structure 138 can support up to (4×16×2D) individual one-byte FDCs per frame using the techniques of the present invention. Alternatively, the (4×16×2D) bytes reserved for the FDC can be distributed among fewer multiple-byte FDCs. If a very long messaging capability (e.g., greater than 128D bytes per frame) is required (for FDC capacity used in total or in part), the G.709 specification includes an 8-bit multiframe alignment signal or MFAS that delineates iterative sequences of 256 frames. For example, if the MFAS is used to delineate the bounds of a single FDC messaging sequence, the total FDC capacity would expand from 128D bytes per frame to 32,768D bytes per multi-frame.

The provision of an FDC in this manner does not affect the frame rate as specified under the completely standardized G.709 frame structure (and, consequently, the original client data and the overhead portion of the data frame byte rate are left unchanged). Although the number of bytes allocated to FEC may be reduced, a sufficient amount of frame space is preferably retained for use by the FEC process. In other words, data frame structure 138 can utilize frame space that would otherwise be wasted on unnecessary FEC bytes and allocate such frame space to additional in-band data communication.

In accordance with one practical embodiment of the present invention, the integer values of T and D in data frame structure 138 are fixed for a given section or path data channel communication. The respective values will be largely dependent on the error rate of the channel and as influenced by the need for increased/decreased FDC bandwidth along the channel. In a practical embodiment, T is selected (a priori or in response to empirical performance data) to provide a number of FEC bytes 142 that is suited to the given channel conditions. Thus, if a relatively strong FEC scheme is required, the value of T can be increased by an appropriate amount. In contrast, if a relatively weak FEC scheme is required, the value of T can be decreased by an appropriate amount. The value of D is selected such that the expression F=(D+T) is satisfied for a given frame rate and further influenced by the degree of error free performance margin by which the system operator chooses to operate the system.

In accordance with an another practical embodiment of the present invention, the integer values of T and D in data frame structure 138 may be dynamically varied while holding the OTUkV transport stream to a constant frame rate, which ensures a fixed client payload capacity. In this embodiment, the number of FDC data bytes and the quantity of FEC parity bytes can be dynamically varied from one frame to the next. The client data payload capacity in each data frame can be held constant by restricting the sum of D and T to a constant value, e.g., D+T=F. For example, if F=8 (which results in a client data payload capacity identical to the conventional IrDI data frame), D=1, and T=7, then the FDC provides an FDC of 128 bytes per frame and the FEC process delivers error detection/correction for up to 448 byte-errors per frame. As another example, if F=8, D=2, and T=6, the FDC is 256 bytes per frame and the FEC process can detect/correct up to 384 byte-errors per frame.

This alternate data frame structure still provides a highly flexible FDC with the additional capability of real-time FDC bandwidth and FEC coding gain control. This real-time control is accomplished using frame synchronous D and T parameter adjustment while maintaining the constant bit rate required for serial channel clock and data recovery. Thus, changes to the dynamically allocated FDC and FEC parameters occur synchronously with frame boundaries (to avoid loss of frame data content). In a practical embodiment, network operators and/or suitably configured network equipment such as edge components would coordinate D and T parameter alteration according to an a priori change sequence. In this regard, an "a priori change sequence" stipulates that coordination of FDC/FEC bandwidth allocation is required in advance to permit channel communications equipment to frame-synchronously adjust their internal configurations to properly process the dynamically variable FDC/FEC parity data allocations.

Figure 7:
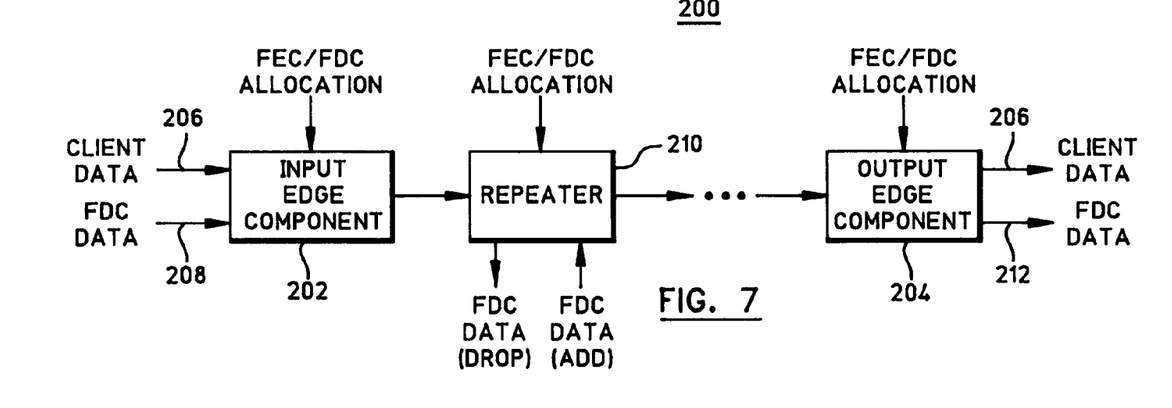
FIG. 7 is a schematic representation of an optical transport network link that supports an FDC.

Data frame structures configured in accordance with the present invention may be created, transported, received, and processed by various components in a data communication system such as an optical transport network. For example, FIG. 7 is a schematic representation of an optical transport network link 200 that supports an FDC as described above. Link 200 represents a data communication path (which may be bidirectional) between an input edge component 202 and an output edge component 204. Input edge component 202 receives client data 206 and/or in-band channel data (i.e., FDC data) 208, generates data frame structures that contain the data, and serially transmits the data frame structures to the destination output edge component 204. Input edge component 202 may be implemented in hardware, software, firmware, or any combination thereof. In a practical embodiment, input edge component 202 can leverage any number of techniques and features utilized by conventional OTN input edge components.

Link 200 may optionally include one or more repeaters 210 configured to receive, process, and retransmit the data frame structures. Thus, link 200 may include any number of sections, where a "section" refers to two neighboring components and the interconnecting sublink (with no intervening components). For example, link 200 has one section that includes input edge component 202 and repeater 210, and another section that includes repeater 210 and output edge component 204. Repeater 210 may be implemented in hardware, software, firmware, or any combination thereof. In a practical embodiment, repeater 210 can leverage any number of techniques and features utilized by conventional OTN repeaters.

Eventually, output edge component 204 receives a sequence of serial data frames, processes the frames, and extracts client data 206 and FDC data 212 from the data frames. Assuming that FDC data 208 was not modified in transit, then FDC data 212 should correspond to FDC data 208. In practical embodiments, however, repeater 210 (and/or any number of repeaters in link 200) can add and/or drop FDC data in one or more data frame structures, thus changing the FDC data 208 in transit. As described in more detail below, output edge component 204 may also be configured to process network error data and to generate FEC/FDC byte allocation parameters that govern the allocation of FEC parity bytes and FDC bytes in the data frame structures (alternatively, the FEC/FDC byte allocation parameters can be generated by any suitably configured component or feature of the OTN or by a network administrator/operator). Output edge component 204 may be implemented in hardware, software, firmware, or any combination thereof. In a practical embodiment, output edge component 204 can leverage any number of techniques and features utilized by conventional OTN output edge components.

As shown in FIG. 7, input edge component 202, repeater 210, and output edge component 204 are capable of obtaining the FEC/FDC byte allocation parameters. In one practical embodiment, the FEC/FDC byte allocation parameters are included as part of the overhead data in data frames transported in the reverse channel direction. In another embodiment, the byte allocation parameters are included as part of the FDC data in frames transported in the reverse channel direction. In yet another embodiment, the FEC/FDC byte allocation parameters may be transported in the forward in-band channel to function as a self-stimulus for the various OTN components. Certain functions of these components are governed by the byte allocation parameters: data frame formatting, FEC processing, deframing, and the like. The FEC/FDC byte allocation parameters can be: determined and fixed for link 200 or portions thereof; initially determined and periodically updated for link 200 or portions thereof; or dynamically varied in real time in response to current conditions of the OTN, link 200, or portions of link 200.

Figure 8:
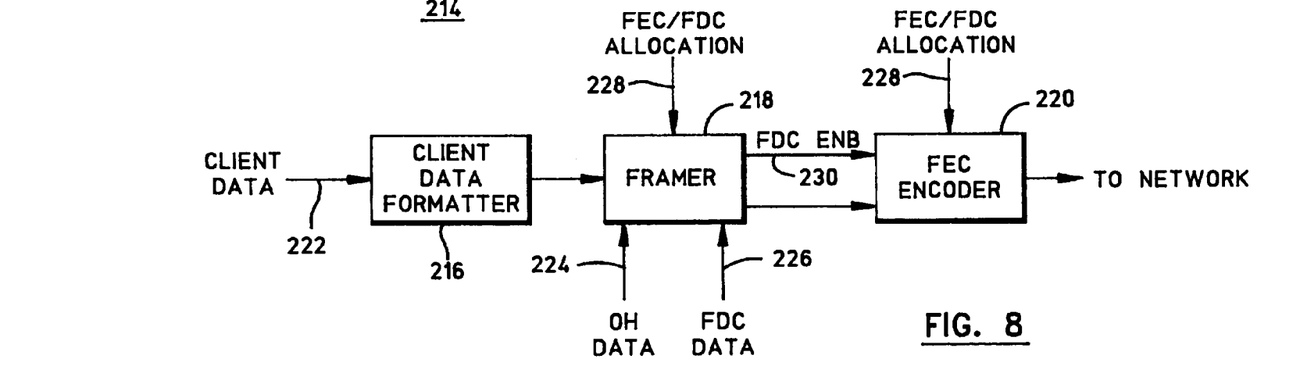
FIG. 8 is a schematic representation of an input edge component that supports an FDC.
Figure 9:
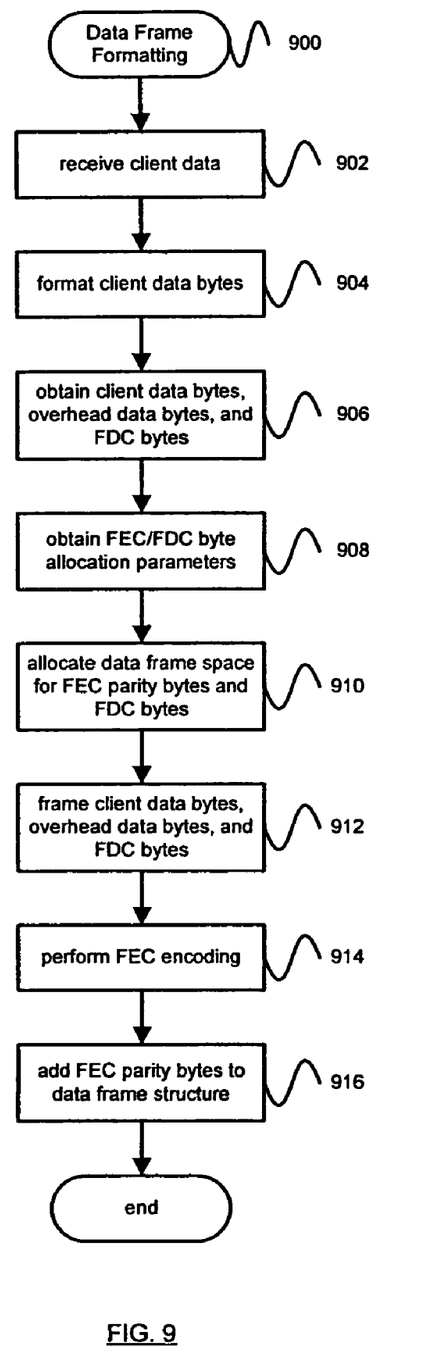
FIG. 9 is a flow diagram of a data frame formatting process.

FIG. 8 is a schematic representation of an input edge component 214 that supports an FDC, and FIG. 9 is a flow diagram of a data frame formatting process 900 that may be performed by input edge component 214. Input edge component 214 represents one possible configuration of input edge component 202 (see FIG. 7). Input edge component 214 generally includes a client data formatter 216, a framer 218, and a FEC encoder 220. Client data formatter 216 has an input node (or element) for receiving client data 222 (task 902). In this regard, client data 222 may include data from any number of distinct sources. Client data 222 may be received as one or more streams of serial data, as blocks of data, or in any suitable format. Client data formatter 216 is configured to process and arrange the raw client data 222 into a suitable format (task 904). In the context of the example embodiment, client data formatter 216 arranges the client data 222 into 8-bit bytes compatible with the preferred data frame structure described above and suitably rate adjusts the composite client data stream to match the required communication channel frame data rate. Any number of techniques including the use of first-in-first-out (FIFO) and/or "stuff" bytes may be used to match the aggregate client data rate to the OTUk or OTUkV frame data rate.

The output of client data formatter 216 is coupled to a client data input node (or element) of framer 218. Framer 218 also includes an overhead data input node (or element) configured to receive overhead data 224 and an in-band channel data input node (or element) configured for receiving in-band channel data 226. Accordingly, framer 218 obtains client data, overhead data, and in-band channel data (i.e., FDC data) for processing (task 906). Framer 218 may also be configured to receive or otherwise obtain FEC/FDC byte allocation parameters 228 (task 908) that convey both the size of the frame allocation of FEC area allocation (F) and a specified FEC magnitude or strength (T), for example, F=y and T=x. For purposes of this example only, assume that y=8 and x=5 and, therefore, the FEC is capable of correcting up to 5 errors and the FDC will possess a 2(F−T) byte capacity per codeword.

Briefly, framer 218 constructs partially filled data frame structures (i.e., frames lacking FEC parity bytes) arranged as described above in connection with FIG. 6. Accordingly, framer 218 is suitably configured to allocate the fixed FEC/FDC data frame space between a first portion reserved for the in-band channel data bytes and a second portion reserved for the FEC parity bytes (task 910). The division of the FEC/FDC data frame space is dictated by the FEC/FDC byte allocation parameters. In accordance with one practical embodiment, task 910 allocates a first fixed byte capacity of the FEC/FDC data frame space for the in-band channel data bytes, and a second fixed byte capacity for the FEC parity bytes. In accordance with an alternate embodiment, the data frame space allocated during task 910 can dynamically vary along with the FEC/FDC byte allocation parameters. For the example data frame (IaDI compliant) where T=x=5, task 910 allocates 160 bytes per row (640 bytes per frame) for FEC parity bytes. Consequently, for the example data frame, where D+T=F=8 and D=3, task 910 allocates 96 bytes per row (384 bytes per frame) for FDC bytes.

During a task 912, framer 218 frames the client data bytes, overhead data bytes, and in-band channel data bytes into a data frame structure compliant with the structure shown in FIG. 6. During task 912, framer 218 frames the client data bytes into the client data payload section of the data frame structure, inserts the overhead data bytes into the fixed overhead data frame space of the data frame structure, and inserts the in-band channel data bytes into the respective portion of the FEC/FDC data frame space.

The data frame output of framer 218 is coupled to a data frame input node (or element) of FEC encoder 220. Following task 912, the "partially filled" data frame structure is routed to FEC encoder 220. FEC encoder 220 is also configured to receive or otherwise obtain the FEC/FDC byte allocation parameters 228, of which only the FEC magnitude of T=x is utilized. FEC encoder 220 performs FEC encoding (task 914) by first performing a frame synchronous 1:16 demultiplexing of the input stream. Next, each of the demultiplexer outputs is coupled to one of sixteen individual FEC encoders within FEC encoder 220. Then, based on the value T only, each of the sixteen FEC encoders is configured to process 255−2T encoder input bytes (including F−2T FDC bytes) before adding 2T FEC parity bytes into the respective encoder portions of the FEC/FDC data frame space (task 916). Eventually, each of the sixteen FEC encoder outputs are 16:1 multiplexed together into a single frame row serial stream. Each subsequent frame row is processed in a similar manner before the start of a new frame. FEC encoder 220 may employ any suitable FEC encoding scheme, which may be known, derivative of a known technique, or an encoding scheme developed in the future. Notably, the resulting FEC process covers the overhead bytes, the client data bytes, and FDC bytes. Once the FEC parity bytes have been added to the data frame structure, input edge component 214 can send the formatted data frame to the network.

Framer 218 may generate a FDC enable signal 230 that regulates the operation of FEC encoder 220. In this regard, if the FDC feature is enabled, then FEC encoder 220 processes the FEC/FDC byte allocation parameters 228 and performs the FEC encoding in an appropriate manner. If, however, the FDC feature is disabled (i.e., the stream of data frame structures is not provisioned with the FDC), then FEC encoder 220 will substitute the F for the T parameter of FEC/FDC byte allocation parameters 228 and perform conventional FEC encoding utilizing the entire FEC area allocation space.

Figure 10:
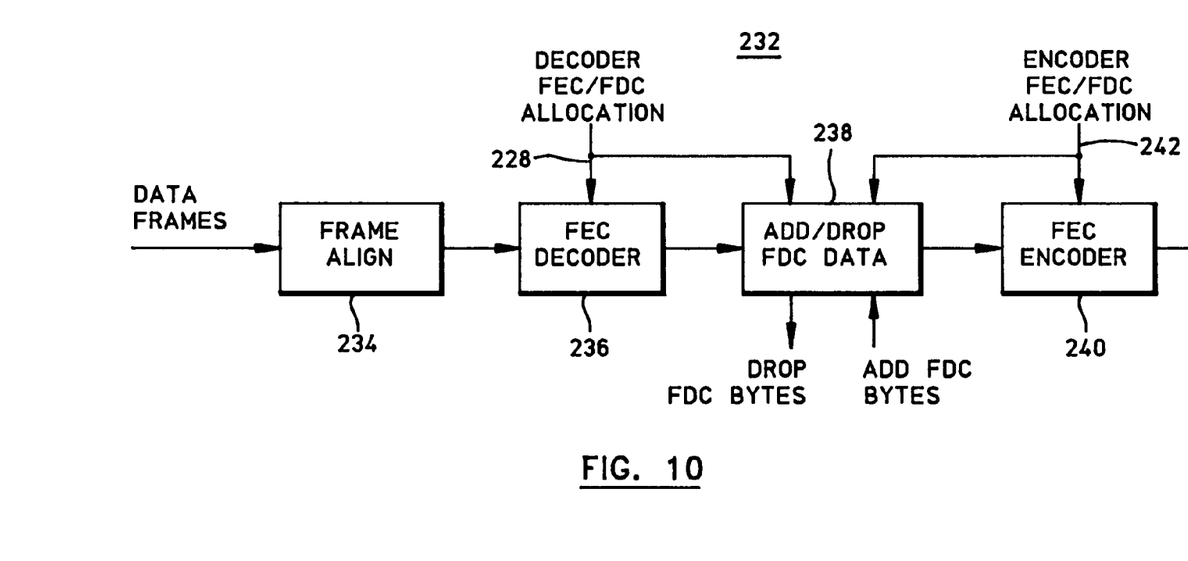
FIG. 10 is a schematic representation of a repeater that supports an in-band data channel.
Figure 11:
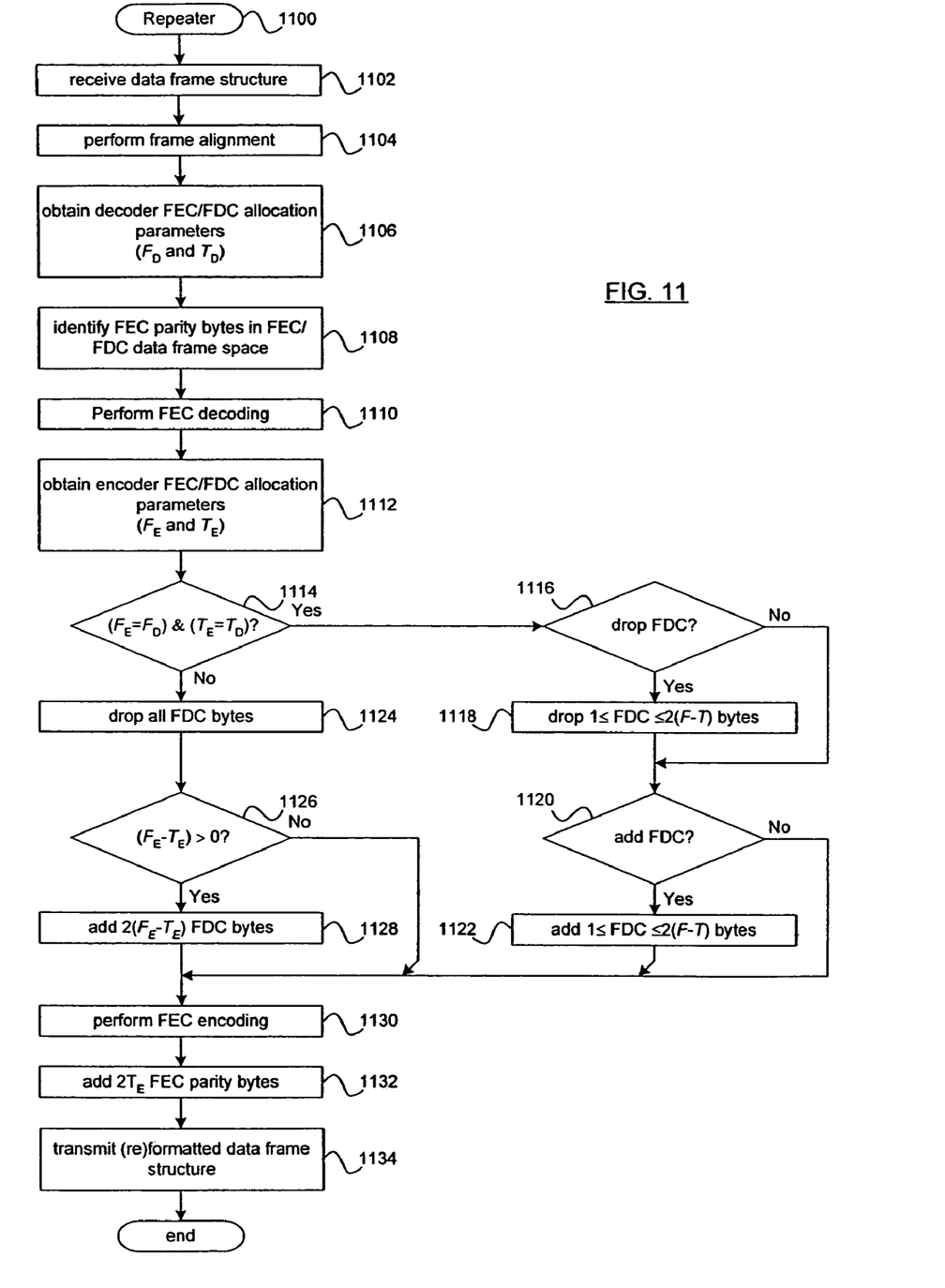
FIG. 11 is a flow diagram of a repeater process.

FIG. 10 is a schematic representation of a repeater 232 that supports an FDC, and FIG. 11 is a flow diagram of a repeater process 1100 that may be performed by repeater 232. Repeater 232 generally includes a frame aligner 234, a FEC decoder 236, an add/drop element 238, and an FEC encoder 240. Repeater 232 is suitably configured to receive incoming data frames, align the frames, perform FEC decoding to correct errors, perform FEC encoding to the corrected frames, and transmit the resulting frames to the next OTN component in the link. Repeater 232 may also be configured to add FDC bytes to a frame and/or drop FDC bytes from a frame before retransmitting the data frame. Repeater 232 may also be configured to change the magnitude/strength of the FEC encoding such that the number of FEC parity bytes in the incoming data frame is different than the number of FEC parity bytes in the retransmitted data frame.

Repeater 232 receives a sequence of data frames (task 1102), where each of the data frames support an FDC. In this regard, the data frame structures can be configured as described above in connection with data frame structure 138 (see FIG. 6). Frame aligner 234 receives the incoming data frames and performs frame alignment (task 1104) to delineate the start and end of the data frames. Frame aligner 234 employs conventional techniques to identify a frame alignment signal and/or a multiframe alignment signal conveyed in the overhead data portion of each data frame.

FEC decoder 236 receives the aligned data frames, along with decoder FEC/FDC byte allocation parameters 228 (task 1106). Assuming that repeater 232 is the first repeater in the link, the byte allocation parameters received by FEC decoder 236 represent the same byte allocation parameters utilized by input edge component 214. In the example scenario, byte allocation parameters 228 convey the values F=y=8 and T=x=5. FEC/FDC byte allocation parameters 228 enable repeater 232 to identify the quantity of FEC bytes contained in the FEC/FDC data frame space of the frame structure. Once the FEC bytes have been identified (task 1108), FEC decoder 236 can perform FEC decoding (task 1110) to correct byte errors in the current data frame structure. The FEC decoding performed during task 1110 is responsive to the FEC parity bytes contained in the data frame structure, which correspond to a FEC process having the specified magnitude/strength. In an ideal environment, the FEC process and the number of FEC parity bytes is sufficient to correct all of the byte errors in the data frame such that the output of FEC decoder 236 represents an error-free corrected version of the original data frame.

Repeater process 1100 obtains encoder FEC/FDC byte allocation parameters 242 (task 1112), then evaluates their equivalence to the respective decoder FEC/FDC byte allocation parameters values 228 (task 1114). If task 1114 determines that $F_E=F_D$ and $T_E=T_D$, then repeater process 1100 contemplates an optional add/drop feature that allows repeater 232 to add and/or drop FDC bytes to the current data frame structure. If FDC bytes are to be dropped (query task 1116), then repeater 232 drops one or more of the FDC bytes contained in the current frame (task 1118). As depicted in FIG. 11, during task 1118, up to 2(F−T) FDC bytes can be dropped. If query task 1116 determines that no FDC bytes are to be dropped, then a query task 1120 is performed.

Query task 1120 tests whether one or more new FDC bytes are to be added or inserted into the current data frame structure. If so, then repeater 232 adds one or more FDC bytes into the current frame (task 1122). During task 1122, up to 2(F−T) FDC bytes can be added. If query task 1120 determines that no FDC bytes are to be added, then repeater process 1100 flows to a task 1130 (described below).

If the FDC payload is to remain unchanged (i.e., no FDC bytes will be added or dropped), then the data frame output of FEC decoder 236 serves as the input to FEC encoder 240. In other words, add/drop element 238 is either bypassed or disabled. If, however, the content of the FDC data payload is to change (all or in part), then task 1118 and/or 1122 are performed. In a practical embodiment, tasks 1118 and 1122 may be combined into a single procedure. The specific manner in which repeater 232 adds and drops FDC bytes may be similar to conventional techniques that govern the adding/dropping of overhead bytes in an OTN. By adding and/or dropping FDC bytes, repeater 232 is capable of changing the contents of the FEC/FDC data frame space from a first set of in-band channel data bytes to a second set of in-band channel data bytes.

The amount of FDC bytes added and/or dropped may vary depending upon the particular application and the current operating conditions. For example, the total number of FDC bytes may increase, decrease, or remain unchanged after processing by add/drop element 238. In addition, the amount of data frame space allocated to FDC bytes may increase, decrease, or remain unchanged in response to encoder FEC/FDC byte allocation parameters 242 (described in more detail below).

If task 1114 determines that $F_E \neq F_D$ or $T_E \neq T_D$, then (in the example embodiment) all FDC bytes are unconditionally dropped (task 1124) due to the change in FDC capacity/bandwidth. Usually, external network elements will determine which received FDC bytes (if any) will propagate to the repeater 232 output. A query task 1126 evaluates the size of the encoder FDC capacity and, if greater than zero, can add $2(F_E-T_E)$ FDC bytes to the FEC allocation area (task 1128). Otherwise, repeater process 1100 performs FEC encoding utilizing the entire $F_E$ space.

As mentioned above, repeater 232 may receive encoder FEC/FDC byte allocation parameters 242 (task 1112), which determine a new allocation of FEC parity bytes and FDC bytes within the FEC/FDC data frame space. Byte allocation parameters 242 may be necessary to handle a change in the number of FDC bytes and/or a change in the number of FEC parity bytes. As described above in connection with input edge component 214, byte allocation parameters 242 determine the magnitude/strength of the new FEC process and the number of FEC parity bytes utilized for the new FEC process. Repeater 232 performs FEC encoding (task 1130) in response to the encoder FEC/FDC byte allocation parameters 242 and adds $2T_E$ FEC parity bytes to the outgoing data frame structure (task 1132).

Eventually, the reformatted data frame structures (which may or may not reflect a modified FDC payload) are transmitted from repeater 232 to the next component in the OTN (task 1134). Using this technique, the amount of data frame space allocated to FEC can be optimized to compensate for current performance characteristics of individual sections within the data communication link. Thus, if the section following repeater 232 has a higher signal-to-noise ratio, then a weaker FEC process can be used and more data frame space can be allocated to the FDC.

Figure 12:
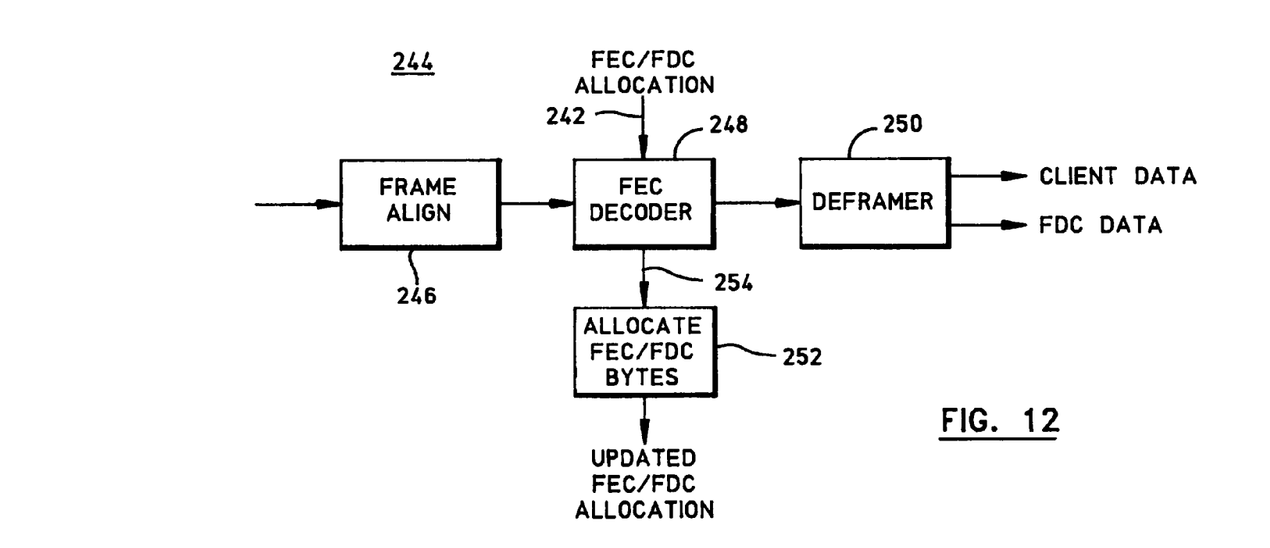
FIG. 12 is a schematic representation of an output edge component that supports an in-band data channel.
Figure 13:
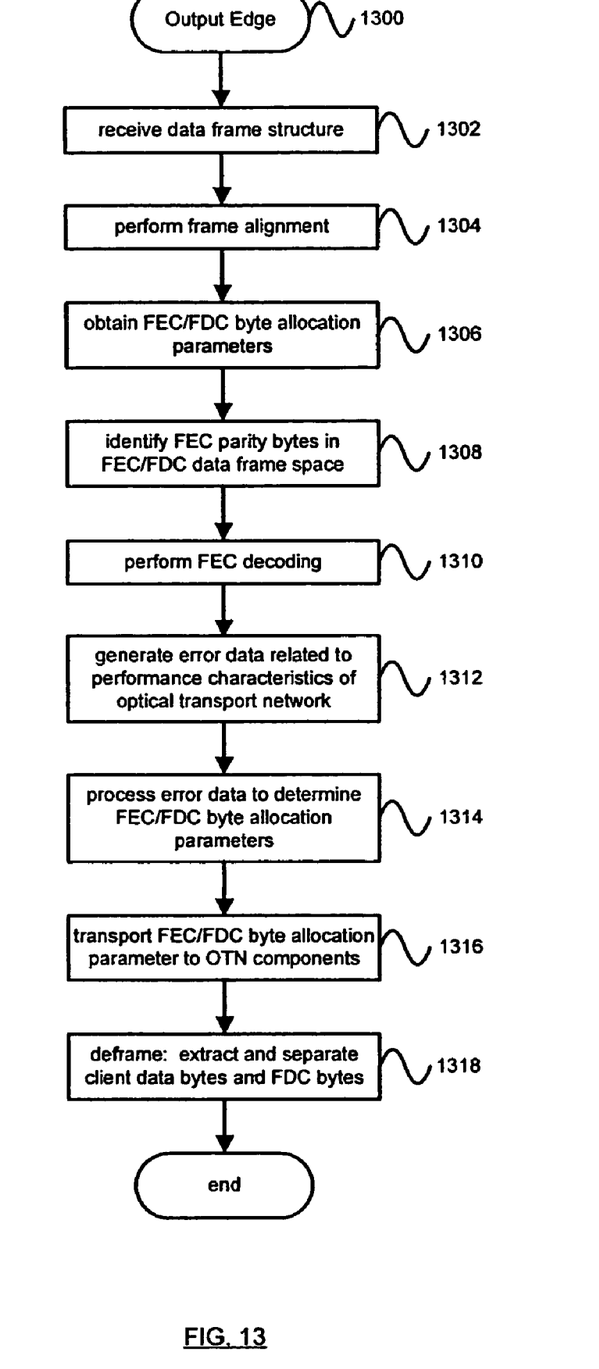
FIG. 13 is a flow diagram of an output edge process.

Eventually, the data frame structures are received by the destination component. FIG. 12 is a schematic representation of an output edge component 244 that supports an FDC, and FIG. 13 is a flow diagram of an example output edge process 1300 that may be performed by output edge component 244. Output edge component 244 generally includes a frame aligner 246, a FEC decoder 248, a deframer 250, and a FEC/FDC byte allocator 252. Output edge component 244 is suitably configured to receive incoming data frame structures, align the frames, perform FEC decoding to correct errors, and perform deframing to extract the client data and the in-band channel data from the frame structures. Output edge component 244 may also be configured to process error data for purposes of generating the FEC/FDC byte allocation parameters described herein.

Frame aligner 246 and FEC decoder 248 function in the manner described above in connection with frame aligner 234 and FEC decoder 236 (see FIG. 10). Likewise, tasks 1302, 1304, 1306, 1308, and 1310 of output edge process 1300 are equivalent to respective tasks 1102, 1104, 1106, 1108, and 1110 of repeater process 1100. In accordance with the example embodiment described herein, FEC decoder 248 receives encoder FEC/FDC byte allocation parameters 242 for compatibility with the outgoing data frames encoded by repeater 232.

FEC decoder 248 corrects byte errors in the data frame structures and passes the corrected data frames to deframer 250, which is coupled to FEC decoder 248. FEC decoder 248 may also be configured to generate error data 254 related to performance characteristics of the section, path, or other aspects of the OTN (task 1312). Such error data may include, without limitation: the number of "zero" errors per frame; the number of "one" errors per frame; the number of corrected byte errors per codeword or frame; the number of uncorrectable byte errors per codeword or frame; and the like. The error data represents the data transmission quality of the section or path under consideration.

Error data 254 is processed by FEC/FDC byte allocator 252 to determine an updated set of FEC/FDC byte allocation parameters 256 (task 1314). In practice, FEC/FDC byte allocator 252 processes the raw error data 254 and determines the FEC magnitude suitable for use under the current conditions. In this regard, the resulting byte allocation parameters 256 may reflect new values for T and F. The updated byte allocation parameters 256 can then be transported to other components in the OTN as necessary (task 1316). Thus, the FEC/FDC byte allocation handled by the input edge component, the repeater(s), and/or the output edge component can be made dynamically variable for real time optimization of the data frame space, particularly the data frame space allocated to the in-band channel data.

Deframer 250 receives the error corrected data frames from FEC decoder 248 and performs a suitable deframing process to extract and separate overhead bytes and the client data bytes from the FDC bytes contained in the corrected data frames (task 1318). Deframer 250 may employ any number of conventional techniques to identify the client data bytes and to deinterleave the client data bytes to obtain the original raw client data. Likewise, deframer 250 is configured to identify and deinterleave the FDC bytes to extract the intended FDC data.

Figure 14:
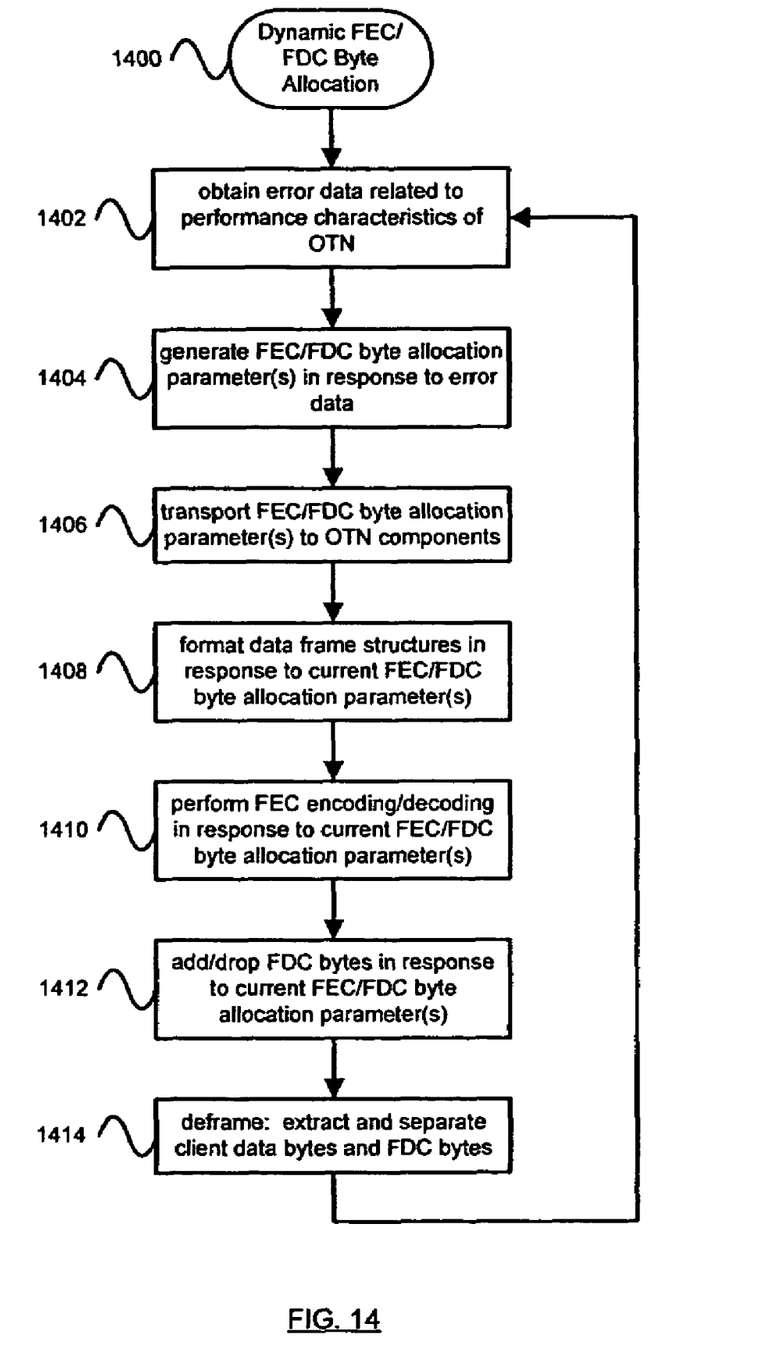
FIG. 14 is a flow diagram of a FEC/FDC byte allocation process.

FIG. 14 is a flow diagram of a FEC/FDC byte allocation process 1400 that represents the handing of data frame structures by a link such as link 200. Process 1400 begins with a task 1402, which obtains error data related to performance characteristics of the data communication network. In the example embodiment described above, the network is an OTN, and the error data is obtained from a FEC decoder element located at an output edge device. A task 1404 generates FEC/FDC byte allocation parameters in response to the error data. Task 1404 may be performed by one or more network components, e.g., by an output edge device, or by a network operator. Depending upon the specific network configuration, task 1404 may generate different byte allocation parameters for use in connection with different sections or segments of the communication link. In this regard, the byte allocation parameters are transported to one or more network components (task 1406), such as an input edge components and any number of repeaters.

The current FEC/FDC byte allocation parameters are utilized by the network components (e.g., input edge components and/or repeaters) to format data frame structures having a specified number of FEC parity bytes and a specified number of FDC bytes (task 1408). In addition, the current byte allocation parameters are utilized by the network components to perform FEC encoding and decoding according to the appropriate FEC magnitude dictated by the number of allocated FEC parity bytes (task 1410).

One or more repeaters may be configured to add or drop FDC bytes in response to the current FEC/FDC byte allocation parameters (task 1412), as described above in connection with repeater 232. Ultimately, an output edge component receives the data frame structures and performs a deframing procedure to extract and separate the client data bytes and the FDC bytes. As shown in FIG. 14, process 1400 can be continuously repeated to respond to real time changes in channel conditions that may impact the number of byte errors and the level of FEC necessary to correct such byte errors. In this manner, the data communication link forms a closed feedback loop that responds to current error conditions, dynamically adjusts the magnitude of FEC applied to the data frame structures, and dynamically varies the number of FDC bytes contained in the data frame structures.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An optical transport network data frame structure comprising:
    a fixed number of client data bytes in a data frame; and
    a fixed number of non-client data bytes in the data frame, the fixed number of non-client data bytes comprising a number of in-band channel data bytes and a quantity of forward error correction ("FEC") parity bytes, the combination of said number of in-band channel data bytes and said quantity of FEC parity bytes occupying a fixed space in the data frame allocated for FEC parity bytes.

2. A data frame structure according to claim 1, wherein said non-client data bytes comprise a fixed number of overhead bytes.

3. A data frame structure according to claim 1, wherein a fixed quantity of said FEC parity bytes and a fixed quantity of said in-band channel data bytes fully occupy said fixed data frame space.

4. A data frame structure according to claim 1, wherein said fixed number of client data bytes, said number of in-band channel data bytes, and said quantity of FEC parity bytes are arranged in N rows.

5. A data frame structure according to claim 4, wherein N=4.

6. A data frame structure according to claim 5, wherein each of said N rows contains 4,080 bytes.

7. A data frame structure according to claim 6, wherein each of said N rows contains 16 overhead bytes.

8. A data frame structure according to claim 7, wherein each of said N rows contains 3,808 client data bytes.

9. A data frame structure according to claim 8, wherein said data frame structure is compliant with Intra Domain Interface ("IaDI") specifications set forth in ITU-T Recommendation G.709/Y.1331.

10. A data frame structure according to claim 4, wherein:
    each of said N rows contains 32D in-band channel data bytes, 32T FEC parity bytes, and 16[254−2(D+T)] client data bytes; and
    D and T are integers.

11. A data frame structure according to claim 10, wherein the sum of D and T is at least eight and no greater than twenty-five.

12. A data frame structure according to claim 10, wherein the value of T corresponds to a magnitude of FEC applied to said fixed number of client data bytes, to said number of in-band channel data bytes, and to said quantity of FEC parity bytes.

13. A data frame structure according to claim 4, wherein each of said N rows comprises a plurality of interleaved codewords.

14. A data frame structure according to claim 13, wherein each of said N rows consists of 16 interleaved Reed-Solomon codewords, each having a length of 255 bytes.

15. A method of formatting an optical transport network data frame structure, said method comprising:
    obtaining client data bytes and in-band channel data bytes;
    framing said client data bytes into a client data payload section of a data frame structure, said client data payload section having a fixed byte capacity;
    inserting said in-band channel data bytes into a first portion of a fixed forward error correction/forward error correction data channel ("FEC/FDC") data frame space of said data frame structure, said FEC/FDC data frame space having a fixed byte capacity allocated for forward error correction ("FEC"); and adding a quantity of FEC parity bytes into a second portion of said FEC/FDC data frame space.

16. A method according to claim 15, further comprising:
allocating a first fixed byte capacity of said FEC/FDC data frame space for said in-band channel data bytes; and
allocating a second fixed byte capacity of said FEC/FDC data frame space for said quantity of FEC parity bytes.

17. A method according to claim 16, wherein allocating said second fixed byte capacity is responsive to performance characteristics of a data communication network that supports said data frame structure.

18. A method according to claim 16, wherein said in-band channel data bytes and said quantity of FEC parity bytes fully occupy said FEC/FDC data frame space.

19. A method according to claim 15, wherein:
said framing step arranges said client data bytes into N rows;
said inserting step arranges said in-band channel data bytes into said N rows; and
said adding step arranges said FEC parity bytes into said N rows.

20. A method according to claim 19, wherein:
N=4; and
each of said N rows contains 4,080 bytes.

21. A method according to claim 20, wherein:
each of said N rows contains 3,808 client data bytes; and
each of said N rows contains 256 bytes allocated to said FEC/FDC data frame space.

22. A data communication apparatus comprising:
a framer having a client data input for receiving client data and an in-band channel data input for receiving in-band channel data, said framer being configured to frame client data bytes representing said client data and in-band channel data bytes representing said in-band channel data into a data frame structure;
said data frame structure comprising a client data payload section having a fixed byte capacity for said client data bytes, and a fixed forward error correction/forward error correction data channel ("FEC/FDC") data frame space having a fixed byte capacity allocated for forward error correction ("FEC") that accommodates said in-band channel data bytes; and
a FEC encoder coupled to said framer, said FEC encoder being configured to receive partially filled data frame structures from said framer and to add a quantity of FEC parity bytes into said fixed FEC/FDC data frame space.

23. A data communication apparatus according to claim 22, wherein:
said framer includes an overhead data input for receiving overhead data; and
said framer is further configured to frame overhead data bytes representing said overhead data into a fixed overhead data frame space of said data frame structure.

24. A data communication apparatus according to claim 22, wherein said framer is further configured to allocate said fixed FEC/FDC data frame space between a first portion reserved for said in-band channel data bytes and a second portion reserved for said quantity of FEC parity bytes.

25. A data communication apparatus according to claim 24, wherein said FEC encoder is further configured to add said quantity of FEC parity bytes to said second portion of said fixed FEC/FDC data frame space.

26. A data communication apparatus according to claim 22, wherein:
said data frame structure consists of four rows, each containing 32D in-band channel data bytes, 32T FEC parity bytes, and 16[254−2(D+T)] client data bytes; and
D and T are integers.

27. A data communication apparatus according to claim 26, wherein the sum of D and T is at least eight and no greater than twenty-five.

28. A data communication method comprising:
receiving a data frame structure comprising a client data payload section having a fixed byte capacity for a number of client data bytes, and a fixed forward error correction/forward error correction data channel ("FEC/FDC") data frame space having a fixed byte capacity allocated for forward error correction ("FEC") that accommodates a number of in-band channel data bytes and a quantity of FEC parity bytes;
performing FEC on said data frame structure in response to said quantity of FEC parity bytes; and
extracting said number of client data bytes and said number of in-band data channel bytes from said data frame structure.

29. A method according to claim 28, further comprising identifying said quantity of FEC parity bytes in said FEC/FDC data frame space.

30. A method according to claim 28, wherein said extracting step separates said number of client data bytes from said number of in-band data channel bytes.

31. A method according to claim 28, wherein said number of in-band channel data bytes and said quantity of FEC parity bytes fully occupy said FEC/FDC data frame space.

32. A method according to claim 28, wherein:
said data frame structure consists of four rows, each containing 32D in-band channel data bytes, 32T FEC parity bytes, and 16[254−2(D+T)] client data bytes; and
D and T are integers.

33. A method according to claim 32, wherein the sum of D and T is at least eight and no greater than twenty-five.

34. A data communication apparatus comprising:
a forward error correction ("FEC") decoder configured to receive a data frame structure comprising a client data payload section having a fixed byte capacity for a number of client data bytes, and a fixed forward error correction/forward error correction data channel ("FEC/FDC") data frame space having a fixed byte capacity allocated for FEC that accommodates a number of in-band channel data bytes and a quantity of FEC parity bytes, said FEC decoder being configured to perform FEC on said data frame structure in response to said quantity of FEC parity bytes; and
a deframer coupled to said FEC decoder, said deframer being configured to extract said number of client data bytes and said number of in-band data channel bytes from said data frame structure.

35. A data communication apparatus according to claim 34, wherein said FEC decoder is further configured to identify said quantity of FEC parity bytes in said FEC/FDC data frame space.

36. A data communication apparatus according to claim 34, wherein said in-band channel data bytes and said quantity of FEC parity bytes fully occupy said FEC/FDC data frame space.

37. A data communication apparatus according to claim 34, wherein:

said data frame structure consists of four rows, each containing 32D in-band channel data bytes, 32T FEC parity bytes, and 16[254−2(D+T)] client data bytes; and D and T are integers.

38. A method according to claim 37, wherein the sum of D and T is at least eight and no greater than twenty-five.

39. A data communication method comprising:

receiving a data frame structure comprising a client data payload section having a fixed byte capacity for a number of client data bytes, and a fixed forward error correction/forward error correction data channel ("FEC/FDC") data frame space having a fixed byte capacity allocated for forward error correction ("FEC") that accommodates a first set of in-band channel data bytes and a first set of FEC parity bytes;

performing FEC on said data frame structure in response to said first set of FEC parity bytes; and changing the contents of said fixed FEC/FDC data frame space from said first set of in-band channel data bytes to a second set of in-band channel data bytes.

40. A method according to claim 39, further comprising replacing said first set of FEC parity bytes in said fixed FEC/FDC data frame space with a second set of FEC parity bytes.

41. A method according to claim 40, wherein:

said first set of FEC parity bytes corresponds to a FEC process having a first magnitude; and said second set of FEC parity bytes corresponds to a FEC process having a second magnitude.

42. A method according to claim 39, wherein said changing step comprises extracting a portion of said first set of in-band channel data bytes.

43. A method according to claim 42, wherein said changing step further comprises adding new in-band channel data bytes to said fixed FEC/FDC data frame space.

44. A method according to claim 39, wherein said changing step comprises adding new in-band channel data bytes to said fixed FEC/FDC data frame space.

45. An optical transport network data frame structure comprising:

four rows of data, each having a total of 4,080 eight-bit bytes;

a forward error correction/forward error correction data channel ("FEC/FDC") data frame space having a fixed byte capacity allocated for forward error correction ("FEC") that accommodates in-band channel data bytes and FEC parity bytes;

each row of data having 16 overhead bytes, 3,808 client data bytes, and 256 bytes allocated to said FEC/FDC data frame space; and said data frame structure being compliant with Intra Domain Interface ("IaDI") specifications set forth in ITU-T Recommendation G.709/Y.1331.

46. A data frame structure according to claim 45, wherein:

said 256 bytes allocated to said FEC/FDC data frame space consists of 32D in-band channel data bytes and 32T FEC parity bytes; and D and T are integers.

47. A data frame structure according to claim 45, wherein each of said rows consists of 16 interleaved Reed-Solomon codewords, each having a length of 255 bytes.

* * * * *